United States Patent
Sagiv et al.

(10) Patent No.: US 9,847,141 B1
(45) Date of Patent: Dec. 19, 2017

(54) CLASSIFYING MEMORY CELLS TO MULTIPLE IMPAIRMENT PROFILES BASED ON READOUT BIT-FLIP COUNTS

(71) Applicant: APPLE INC., Cupertino, CA (US)

(72) Inventors: Barak Sagiv, Kochav Yair (IL); Einav Yogev, Raanana (IL); Eli Yazovitsky, Netanya (IL); Eyal Gurgi, Petach Tikva (IL); Roi Solomon, Petach Tikva (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/225,863

(22) Filed: Aug. 2, 2016

(51) Int. Cl.
| G06F 11/00 | (2006.01) |
| G11C 29/00 | (2006.01) |
| G11C 29/44 | (2006.01) |
| G11C 29/38 | (2006.01) |

(52) U.S. Cl.
CPC ............. *G11C 29/44* (2013.01); *G11C 29/38* (2013.01)

(58) Field of Classification Search
CPC ....... G11C 29/44; G11C 29/38; G11C 29/028; G11C 29/50; G11C 29/5004; G11C 29/08; G11C 29/12; G11C 29/16; G06F 11/2205; G06F 11/2252
USPC ................ 714/723, 737, 745, 718, 721, 763
See application file for complete search history.

(56) References Cited

U.S. PATENT DOCUMENTS

| 7,975,193 | B2 | 7/2011 | Johnson |
| 8,074,011 | B2 | 12/2011 | Flynn et al. |
| 8,380,915 | B2 | 2/2013 | Strasser et al. |
| 9,214,198 | B2 * | 12/2015 | Ellis ..................... G11C 29/021 |
| 2013/0176775 | A1 | 7/2013 | Tang et al. |
| 2014/0108891 | A1 | 4/2014 | Strasser et al. |
| 2015/0006984 | A1 * | 1/2015 | Strasser .............. G06F 12/0246 |
| | | | 714/721 |
| 2015/0193299 | A1 * | 7/2015 | Hyun ..................... G11C 29/52 |
| | | | 714/6.24 |
| 2016/0027521 | A1 | 1/2016 | Lu |
| 2016/0110124 | A1 | 4/2016 | Camp et al. |

\* cited by examiner

*Primary Examiner* — Christine Tu
(74) *Attorney, Agent, or Firm* — D. Kligler IP Services Ltd.

(57) ABSTRACT

A storage apparatus includes a plurality of memory cells and storage circuitry. The storage circuitry is configured to store a mapping that maps sets of readout bit-flip counts to respective predefined impairment profiles. The impairment profiles specify two or more severity levels of respective impairment types, including read disturb, retention and endurance. Each of the bit-flip counts includes a one-to-zero error count or a zero-to-one error count. The storage circuitry is configured to read data from a group of the memory cells using given readout parameters, to evaluate an actual set of bit-flip counts corresponding to the read data, to classify the group of the memory cells to a respective impairment profile by mapping the actual set of the bit-flip counts using the mapping, and to adapt the readout parameters based on the impairment profile to which the group of the memory cells was classified.

20 Claims, 5 Drawing Sheets

US 9,847,141 B1

CLASSIFYING MEMORY CELLS TO MULTIPLE IMPAIRMENT PROFILES BASED ON READOUT BIT-FLIP COUNTS

TECHNICAL FIELD

Embodiments described herein relate generally to data storage, and particularly to methods and systems for improving readout performance by classifying memory cells to multiple impairment profiles.

BACKGROUND

Non-volatile memories may suffer from various types of impairments that degrade their performance. Example impairments affecting the memory cells include read disturb, retention and endurance. Methods for improving the memory readout performance under stressful conditions are known in the art. For example, U.S. Pat. No. 8,380,915, whose disclosure is incorporated herein by reference, describes an apparatus, system, and method for managing solid-state storage media by determining one or more configuration parameters for the solid-state storage media. A media characteristic module references one or more storage media characteristics for a set of storage cells of solid-state storage media. A configuration parameter module determines a configuration parameter for the set of storage cells based on the one or more storage media characteristics. A storage cell configuration module configures the set of storage cells to use the determined configuration parameter.

U.S. Pat. No. 8,074,011, whose disclosure is incorporated herein by reference, describes an apparatus, system, and method for storage space recovery after reaching a read count limit. A read module reads data in a storage division of solid-state storage. A read counter module then increments a read counter corresponding to the storage division. A read counter limit module determines whether the read count exceeds a maximum read threshold, and if so, a storage division selection module selects the corresponding storage division for recovery. A data recovery module reads valid data packets from the selected storage division, stores the valid data packets in another storage division of the solid-state storage, and updates a logical index with a new physical address of the valid data.

SUMMARY

An embodiment that is described herein provides a storage apparatus that includes a plurality of memory cells and storage circuitry. The storage circuitry is configured to store a mapping that maps sets of multiple readout bit-flip counts to respective predefined impairment profiles. The impairment profiles specify two or more severity levels of respective impairment types, including read disturb, retention and endurance. Each of the bit-flip counts includes a one-to-zero error count or a zero-to-one error count. The storage circuitry is configured to read data from a group of the memory cells using given readout parameters, to evaluate an actual set of bit-flip counts corresponding to the read data, to classify the group of the memory cells to a respective impairment profile by mapping the actual set of the bit-flip counts using the mapping, and to adapt the readout parameters based on the impairment profile to which the group of the memory cells was classified.

In some embodiments, the storage circuitry is configured to classify the group of the memory cells without directly measuring the severity levels. In other embodiments, the storage circuitry is further configured to store data in the group of the memory cells in data units of multiple respective bit-significance values, to store a dedicated mapping for each respective bit-significance value, to read from the group of the memory cells a data unit of a given bit-significance value, and to classify the group of the memory cells using the dedicated mapping corresponding to the given bit-significance value. In yet other embodiments, the storage circuitry is further configured to read data that was encoded using an Error Correcting Code (ECC), and to evaluate the bit-flip counts by decoding the read data in accordance with the ECC, so as to derive decoded data and error locations, and to compare the read data with the decoded data at the error locations.

In an embodiment, the readout parameters include one or more read thresholds, and the storage circuitry is configured to adapt the readout parameters by modifying a position of at least one of the read thresholds. In another embodiment, the readout parameters include multiple soft zones and respective zone-specific reliability measures for applying soft decoding to the read data, and the storage circuitry is configured to adapt the readout parameters by modifying at least a soft zone spacing or a zone-specific reliability measure. In yet another embodiment, the storage circuitry is configured to adapt the readout parameters based on corresponding readout parameters that were determined for another group of the memory cells classified to a same impairment profile.

In some embodiments, the storage circuitry is further configured to store the mapping by defining for the impairment profiles respective disjoint clusters in a vector space of the readout bit-flip counts, and to map the actual set of the bit-flip counts by finding a cluster to which a point in the vector space represented by the actual set of the bit-flip counts belongs. In other embodiments, the storage circuitry is further configured to store the mapping by storing for each impairment profile a cluster center in a vector space of the readout bit-flip counts, and to map the actual set of the bit-flip counts by finding a cluster center closest to a point in the vector space represented by the actual set of the bit-flip-counts.

There is additionally provided, in accordance with an embodiment that is described herein, a method for data storage including, in a controller that stores data in a memory that includes a plurality memory cells, storing a mapping that maps sets of multiple readout bit-flip counts to respective predefined impairment profiles. The impairment profiles specify two or more severity levels of respective impairment types, including read disturb, retention and endurance. Each of the bit-flip counts includes a one-to-zero error count or a zero-to-one error count. Data from a group of the memory cells is read using given readout parameters, and an actual set of bit-flip counts corresponding to the read data is evaluated.

The group of the memory cells is classified to a respective impairment profile by mapping the actual set of the bit-flip counts using the mapping. The readout parameters are adapted based on the impairment profile to which the group of the memory cells was classified.

There is additionally provided, in accordance with an embodiment that is described herein, a controller that includes an interface for communicating with a memory that includes a plurality memory cells, and storage circuitry. The storage circuitry is configured to store a mapping that maps sets of multiple readout bit-flip counts to respective predefined impairment profiles. The impairment profiles specify two or more severity levels of respective impairment types including read disturb, retention and endurance. Each of the bit-flip counts includes a one-to-zero error count or a zero-to-one error count. The storage circuitry is configured to read data from a group of the memory cells using given readout parameters, to evaluate an actual set of bit-flip counts corresponding to the read data, to classify the group of the memory cells to a respective impairment profile by mapping the actual set of the bit-flip counts using the mapping, and to adapt the readout parameters based on the impairment profile to which the group of the memory cells was classified.

These and other embodiments will be more fully understood from the following detailed description of the embodiments thereof, taken together with the drawings in which:

DETAILED DESCRIPTION OF EMBODIMENTS

Overview

Figure 1:
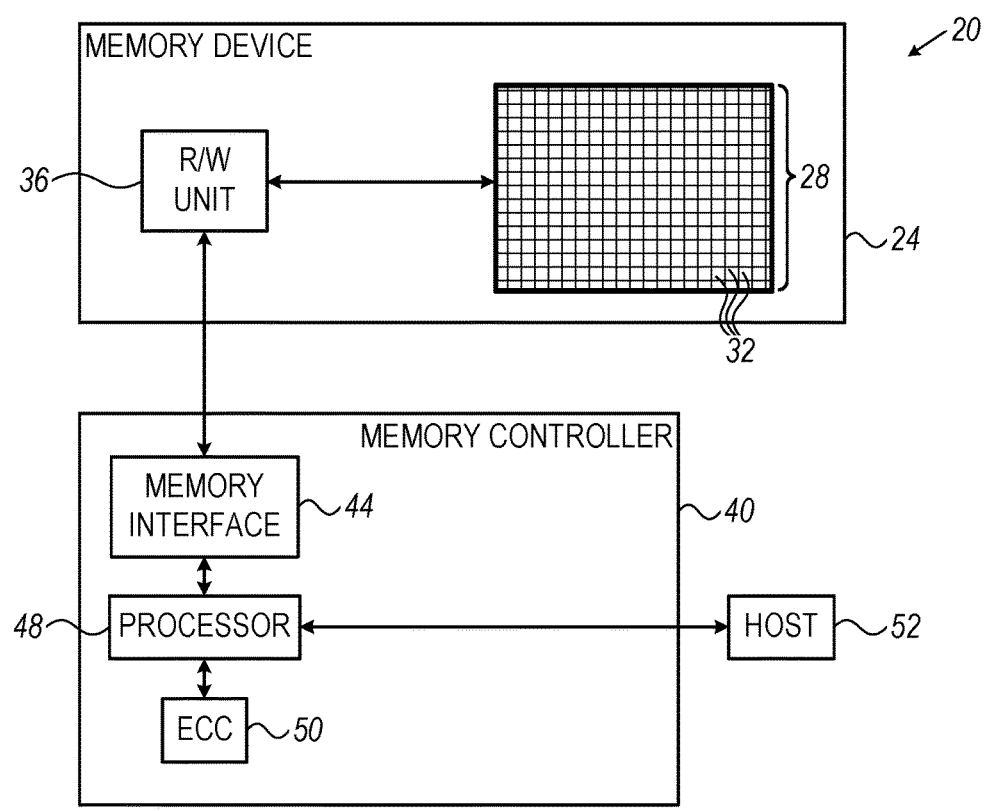
FIG. 1 is a block diagram that schematically illustrates a memory system, in accordance with an embodiment that is described herein.

Various storage systems comprise a controller that stores data in a non-volatile memory device comprising multiple memory cells. The memory device typically stores data in a group of the memory cells by charging the memory cells in the group to assume respective programming levels. For example, a memory device that stores 2 bits/cell maps two bits of data to one of four predefined programming levels. The storage values of the memory cells are also referred to as analog values or threshold voltages.

Reading data from a group of memory cells typically involves setting readout parameters whose values affect the readout performance. For example, the reading operation typically requires setting one or more read thresholds and sensing the threshold voltages of the memory cells in the group relative to the read thresholds. Positioning the read thresholds sub-optimally may result in readout errors.

During the memory device lifetime, the memory cells may suffer from impairments of various types, such as read disturb (distortion of the analog values caused by read operations applied to other memory cells), retention (drifting of the analog values with time), and endurance (deterioration of the physical media of the memory cells due to excessive programming and erasure cycling). The combined effect of these impairments is that the readout performance of memory cells deteriorates with time and usage, leading to read errors and even potential loss of data.

Embodiments that are disclosed herein provide methods and systems for classifying memory cells to multiple predefined impairment profiles, and adjusting the readout parameters accordingly. By using the disclosed techniques, the readout parameters can be adjusted so as to compensate for possible impairments without having to continually measure or track the severity levels of these impairments along the lifetime of the memory. The memory controller is thus relieved of this burden. The adjusted readout parameters can be stored and reused for other memory cells classified to the same impairment profile. The disclosed techniques therefore improve the readout performance in terms of reduced Bit Error Rate (BER) and increased read throughput.

In the disclosed embodiments, the controller holds a mapping that maps sets of readout bit-flip counts to respective predefined impairment profiles. In the present context, a readout bit-flip count is defined as a count (e.g., absolute number, fraction or percentage) of the bits that were read incorrectly from a group of memory cells. A readout bit-flip count may be a zero-to-one error count (a count of bits that were erroneously read as "1" although their correct value was "0"), or a one-to-zero error count (a count of bits that were erroneously read as "0" while their correct value was "1").

The inventors have found that using the individual readout bit-flip counts helps to distinguish between the relative levels of severity of different impairment types. This sort of distinction is not possible when taking into account only the overall error count. Thus, in some embodiments, the controller maps readout bit-flip counts to respective impairment profiles. Each of the impairment profiles specifies two or more severity levels of respective impairment types selected from a list comprising (i) read disturb (ii) retention and (iii) endurance.

During the memory device lifetime, the controller uses given readout parameters to read data from a group of the memory cells that may have suffered from impairments of various types and severity levels, and evaluates an actual set of bit-flip counts corresponding to the read data. The controller classifies the group of the memory cells to a respective impairment profile by mapping the actual set of the bit-flip counts using the mapping, and adapts the readout parameters based on the classified impairment profile.

In this manner, the controller is able to estimate the individual severity level of each impairment type in the data being read, and set the readout parameters that best match this particular combination of severity levels. This setting of readout parameters (e.g., read thresholds) is far more accurate than setting the readout parameters based only on the total error count. For example, one group of memory cells may suffer from extensive read disturb, moderate retention and little or no endurance, while a second group of memory cells may suffer from low read disturb, high retention and moderate endurance. Although the two groups of memory cells in this example may exhibit the same total error count, each should ideally be read with different readout parameters.

The disclosed techniques enable the controller to optimize the readout parameters (e.g., read thresholds) for each group of memory cells, an optimization that is not possible when taking only the total error count into consideration. Note that, at the same time, the disclosed techniques do not require the controller to track the individual impairments (e.g., count P/E cycles, measure retention time or estimate read disturb) over time, but merely to determine the bit-flip counts at readout time.

In some embodiments, the controller stores data in data units of multiple respective bit-significance values, such as Least Significant Bit (LSB) and Most Significant Bit (MSB) pages, and the controller holds a dedicated mapping for each respective bit-significance value. When reading a data unit of a given bit-significance value, the controller classifies the group of the memory cells using the dedicated mapping corresponding to the given bit-significance value.

In some embodiments, the data is stored encoded using an Error Correcting Code (ECC), and to evaluate the bit-flip counts the controller decodes the ECC of the read data and compares the read data with the decoded data at bit locations in which the read data contains errors.

In some embodiments, adapting the readout parameters comprises modifying the position of at least one read threshold. In other embodiments, the ECC decoder comprises a soft decoder that uses as input soft reliability measures assigned to the readout bits. In these embodiments, the memory controller modifies the positions and/or spacing of the soft zones. Alternatively or additionally, the controller re-assigns to the soft zone modified reliability measures.

In some embodiments the mapping comprises multiple disjoint clusters in a vector space of the readout bit-flip counts, and mapping the evaluated bit-flip counts comprises finding a cluster to which a point in the vector space represented by the bit-flip counts belongs. In other embodiments, the mapping comprises only cluster centers in the vector space, and the mapping is performed by finding a cluster center closest to the point in the vector space represented by the evaluated bit-flip-counts.

System Description

FIG. 1 is a block diagram that schematically illustrates a memory system 20, in accordance with an embodiment that is described herein. System 20 can be used in various host systems and devices, such as in computing devices, cellular phones or other communication terminals, removable memory modules, Solid State Disks (SSD), Secure Digital (SD) cards, Multi-Media Cards (MMC) and embedded MMC (eMMC), digital cameras, music and other media players and/or any other system or device in which data is stored and retrieved.

System 20 comprises a memory device 24, which stores data in a memory cell array 28. The memory array comprises multiple memory cells 32, such as analog memory cells. In the context of the present patent application, the term "analog memory cell" is used to describe any memory cell that holds a continuous, analog value of a physical parameter, such as an electrical voltage or charge. Array 28 may comprise solid-state memory cells 32 of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to analog memory, the disclosed techniques may also be used with various other memory types.

The charge levels stored in the cells and/or the analog voltages or currents written into and read out of the cells are referred to herein collectively as analog values, storage values or analog storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell Multi-Level Cell (MLC) can be programmed to assume one of four possible programming levels by writing one of four possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having an integer resolution of one or more bits. Data is typically written to and read from the memory cells in data units that are referred to as data pages (or simply pages, for brevity).

The storage and retrieval of data in and out of memory device 24 is performed by a memory controller 40. Memory controller 40 comprises an interface 44 for communicating with memory device 24, a processor 48, and an Error Correcting Code (ECC) unit 50. The disclosed techniques can be carried out by memory controller 40, by R/W unit 36, or both. Thus, in the present context, memory controller 40 and R/W unit 36 are referred to collectively as storage circuitry that carries out the disclosed techniques.

Memory controller 40 communicates with a host 52, for accepting data for storage in the memory device and for outputting data retrieved from the memory device. ECC unit 50 encodes the data for storage using a suitable ECC and decodes the ECC of data retrieved from the memory. ECC unit 50 may comprise any suitable type of ECC, such as, for example, Low Density Parity Check (LDPC), Reed-Solomon (RS) or Bose-Chaudhuri-Hocquenghem (BCH), can be used. In some embodiments, in decoding the ECC, the decoding process implemented in unit 50 provides as output the recovered data bits as well as locations of data bits that have been flipped by the decoder to correct readout errors. Separate zero-to-one error count and one-to-zero error count can be evaluated by comparing the readout data with the decoded data at the error locations.

Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example system configuration, which is shown purely for the sake of conceptual clarity. Any other suitable memory system configuration can also be used. For example, although the example of FIG. 1 shows a single memory device, in alternative embodiments memory controller 40 may control multiple memory devices 24, e.g., in a RAID storage system. Elements that are not necessary for understanding the principles of the present disclosure, such as various interfaces, addressing circuits, timing and sequencing circuits and debugging circuits, have been omitted from the figure for clarity.

In the example system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device. The memory array is typically divided into multiple memory pages, i.e., groups of memory cells that are programmed and read simultaneously.

In some embodiments, memory pages are sub-divided into sectors. Pages may be mapped to word lines in various manners. Each word line may store one or more pages. A given page may be stored in all the memory cells of a word line, or in a subset of the memory cells (e.g., the odd-order or even-order memory cells).

Erasing of cells is usually carried out in blocks that contain multiple pages. Typical memory devices may comprise thousands of erasure blocks (also referred to as "memory blocks"). In a typical two-bit-per-cell MLC device, each erasure block is on the order of 128 word lines, each comprising several tens of thousands of cells. Each word line of such a device is often partitioned into four pages (odd/even order cells, least/most significant bit of the cells). Two-bit-per-cell devices having 128 word lines per erasure block that store a data page per bit significance value would have 256 data pages per erasure block, and three-bit-per-cell devices would have 384 data pages per block. Alternatively, other block sizes and configurations can also be used.

Threshold Distributions of Memory Cells Under Stress

Figure 2A:
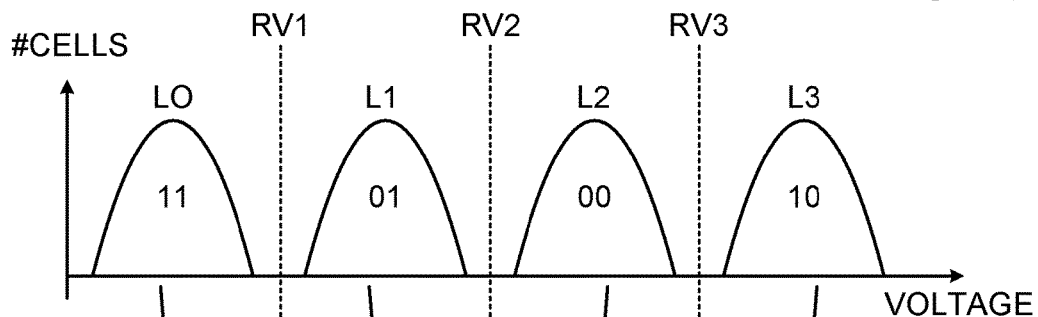
FIGS. 2A-2C are diagrams that schematically illustrate a reference threshold voltage distribution, and additional threshold voltage distributions distorted due to various types of impairments, in accordance with embodiments that are described herein.
Figure 2B:
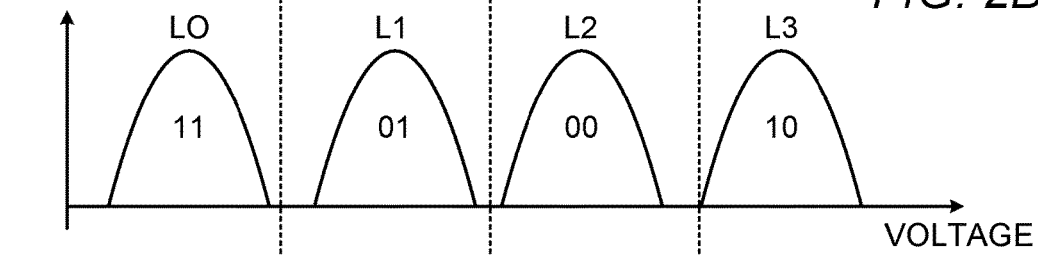
Figure 2C:
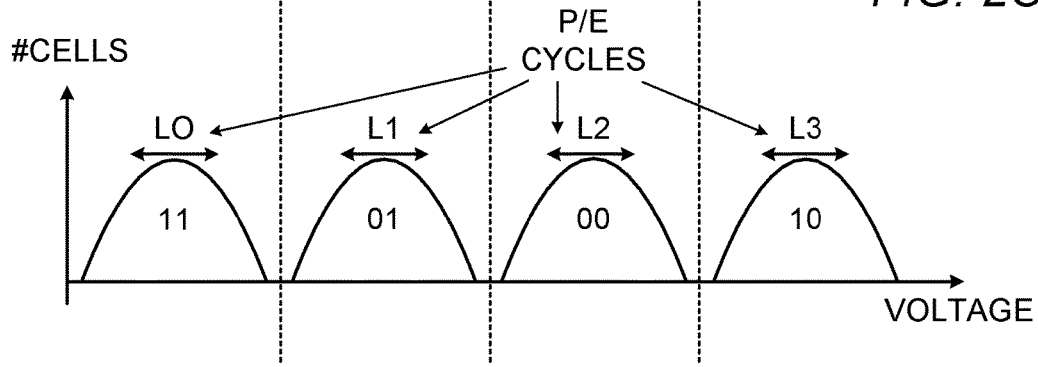

FIGS. 2A-2C are diagrams that schematically illustrate a reference threshold voltage distribution (FIG. 2A), and additional threshold voltage distributions (FIGS. 2B and 2C) distorted due to various types of impairments, in accordance with embodiments that are described herein.

The threshold voltage distributions in FIGS. 2A-2C refer to an MLC memory device that stores 2 bits/cell by mapping bit pairs "11", "01", "00" and "10" to respective four programming levels denoted L0 . . . L3. In this example, the left and right bits in a bit-pair denote a Most Significant Bit (MSB) and a Least Significant Bit (LSB), respectively. The threshold voltage distributions in FIG. 2A represent nominal undistorted distributions as expected, for example, at the memory device start of life.

To retrieve data stored in a group of memory cells, the R/W unit typically sets one or more read thresholds, and senses the threshold voltages of the memory cells in the group relative to the read thresholds. For example, in some embodiments, the read threshold RV2 serves for reading an LSB page, so that threshold voltages sensed above RV2 are interpreted as LSB=0 and threshold voltages sensed below RV2 are interpreted as LSB=1. Similarly, the read thresholds RV1 and RV3 are used for reading MSB pages, so that threshold voltages between RV1 and RV3 are interpreted as MSB=0 and threshold voltages below RV1 or above RV3 are interpreted as MSB=1.

A readout error occurs when the threshold voltage of a memory cell that is programmed to one programming level is interpreted as belonging to another programming level. For example, a LSB readout error may occur when the threshold voltage of a cell programmed to L1, i.e., LSB=1, exceeds RV2 and therefore erroneously interpreted as belonging to L2 and reads as LSB=0. MSB readout errors are likely to occur when memory cells programmed to L0 are misinterpreted as belonging to L1 and vice versa, or when memory cells programmed to L3 are interpreted as belonging to L2 and vice versa. In general, the probability of readout error depends on the positions and shapes of the threshold voltage distributions and on the positions of the read thresholds.

In a typical memory device, the analog values stored in memory cells may be distorted by various types of impairments. The distortion may comprise, for example, retention-related distortion, endurance-related distortion, read disturb, and often a combination of some or all three impairment types.

In FIG. 2B the threshold voltage distributions are distorted due to read disturb and retention. Read disturb refers to an impairment in which reading some memory cells changes the threshold voltages of other memory cells. For example, in reading a given world line in a block of a NAND Flash memory, the transistors comprising the memory cells of the block sharing the same bit line as the memory cell of the word line being read are turned on by applying a high pass-through voltage (also referred to as Vpass), which induces electric tunneling that can shift the threshold voltages of these unread cells to higher values. Since the pass-through voltage is set higher than all the threshold voltages L0 . . . L3, the read disturb impairment tends to affect the lower threshold voltages more severely. In addition, the distortion due to read disturb typically increases gradually with the number of read operations applied during the device lifetime.

Retention-related distortion is typically caused by gradual leakage of electrical charge from the memory cells, causing a drift of the analog values with time to lower values. Typically, memory cells having higher storage charges, i.e., those programmed to higher programming levels, suffer from more sever retention-related distortions.

FIG. 2C depicts threshold voltage distributions distorted due to endurance. Endurance-related distortion is caused by gradual degradation of the physical media of the memory cells due to excessive programming and erasure (P/E) cycling. As seen in the figure, applying to the memory cells of a given block a large number of P/E cycles tends to widen the threshold voltage distributions of all the programming levels and as a result increases the probability of readout errors.

Two relevant properties of the above-described distortion mechanisms are that they all develop or accumulate gradually over time, and that different groups of the memory cells (e.g., memory blocks) may experience different levels of distortion of different types. In addition, the distortion effect due to simultaneous impairments of two or more types may be complex.

The retention, endurance and read disturb effects cause read errors, and the number or likelihood of errors therefore increases with time and usage. The readout performance (e.g., Bit Error Rate—BER) in a given memory block is typically a function of all three effects.

In the disclosed embodiments, the memory controller classifies memory cells to multiple impairment profiles that specify respective predefined impairment levels of read disturb, retention, and endurance. The memory controller adapts the readout parameters for the classified memory cells based on the classification. The classification takes into consideration the combined effect caused by multiple impairments of different types, and frees the memory controller from the burden of explicitly tracking the severity levels of the different impairment types. Since the impairments develop gradually, re-classifying a given group of the memory cells is not required in all read operations, but can be carried out at a relatively low rate.

Mapping Between Bit-Flip Counts and Impairment Profiles

Figure 3:
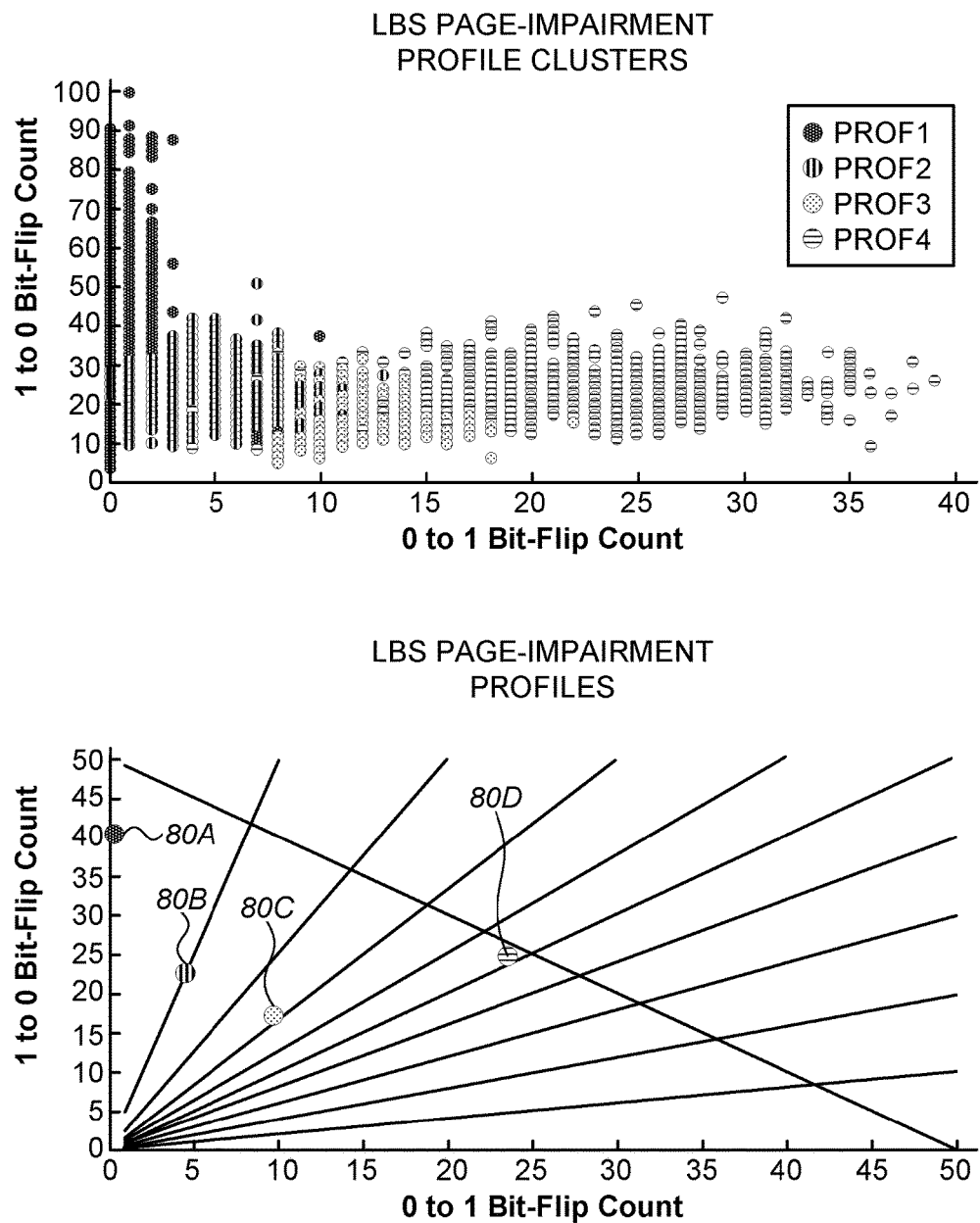
FIGS. 3 and 4 are graphs that schematically illustrate associations between bit-flip counts and impairment profiles, in reading Least Significant Bit (LSB) data and Most Significant Bit (MSB) data, in accordance with embodiments that are described herein.
Figure 4:
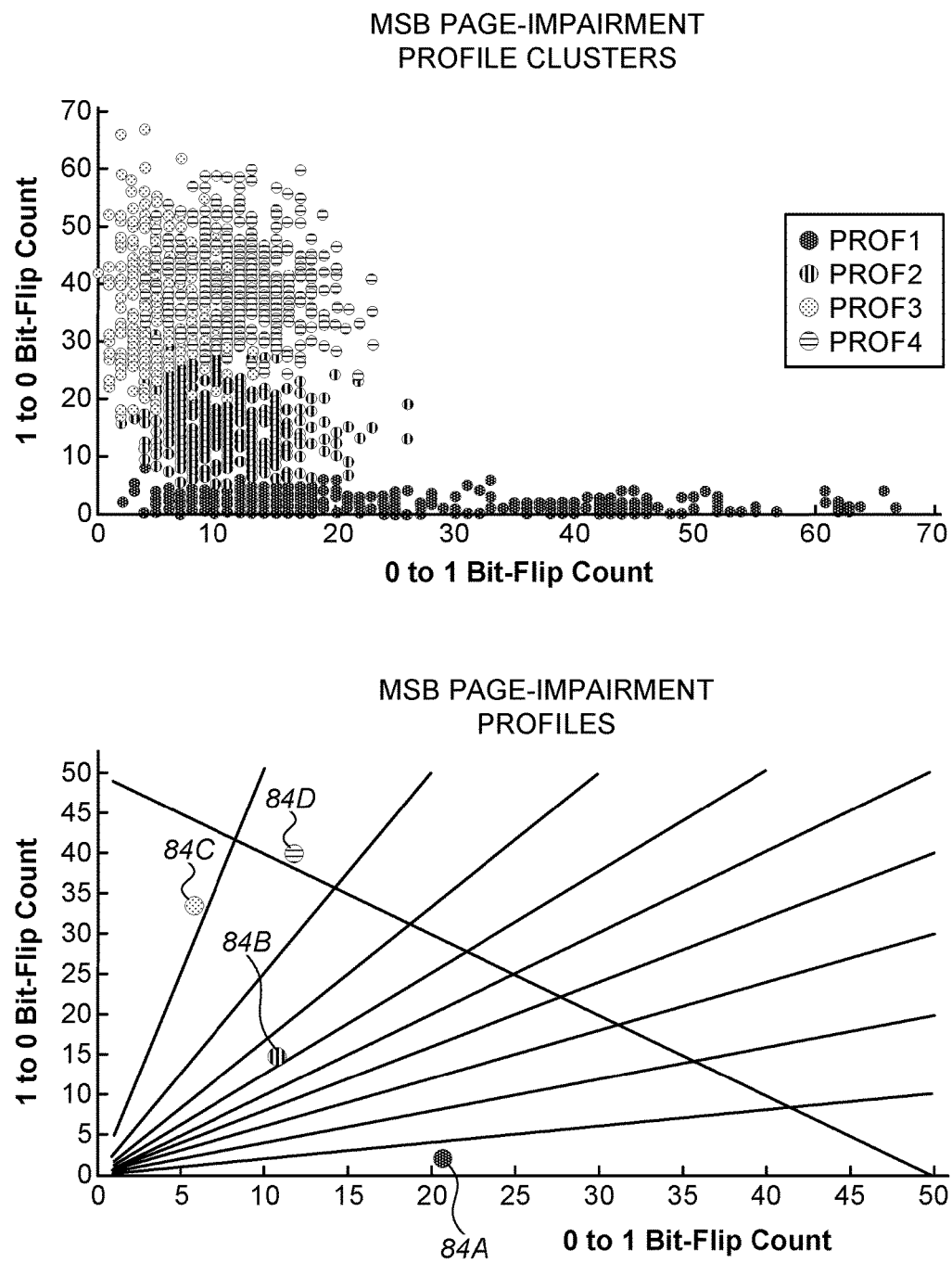

FIGS. 3 and 4 are graphs that schematically illustrate associations between bit-flip counts and impairment profiles in reading LSB and MSB data, in accordance with embodiments that are described herein. In the present example, the impairment profiles comprise three impairment types: (i) read disturb, (ii) retention and (iii) endurance. A given impairment profile thus specifies three severity levels of the respective impairment types.

Typically, different impairment types are defined in different terms and therefore the respective severity levels are measured in different respective manners, as described herein. The severity level of the read disturb impairment is measured as the number of read operations applied to memory cells in other word lines of the memory block containing the group of the memory cells. The severity level of the retention-related impairment is measured as the time of retention. By baking the memory device at high temperatures, long retention periods can be simulated, e.g., baking for 10 hours is equivalent to a retention time of about one year at operational temperatures. The severity level of the endurance-related impairment is measured as the number of P/E cycles applied to the memory block containing the group of the memory cells.

Table 1 below depicts four example impairment profiles denoted PROF1 . . . PROF4.

TABLE 1 example impairment profiles

| Impairment profile/<br>Impairment type | PROF1 | PROF2 | PROF3 | PROF4 |
|---|---|---|---|---|
| Read disturb<br>(# read operations) | 512K | 0 | 0 | 256K |
| Retention | 1 Year | 1 Year | 0 | 1 Year |
| Endurance<br>(# P/E cycles) | 0 | 2K | 4K | 4K |

In the present example, impairment profile PROF1 defines a retention time of one year and a read disturb level of 512000 read operations, PROF2 defines a one year retention and an endurance level of 2000 P/E cycles, PROF3 defines only an endurance-related impairment of 4000 P/E cycles, and PROF4 defines a read disturb level of 256000 read operations, a retention time of one year, and an endurance level of 4000 P/E cycles.

Consider a group of memory cells being read using certain read thresholds at the memory start of life. We assume that the read thresholds are set optimally (or close to optimally), which results in a minimal BER. The read thresholds that were set optimally at start of life typically become suboptimal under stress conditions or impairments that develop over time, and as such may result in erroneous readouts. In the disclosed embodiments, the readout errors are divided into two types, i.e., zero-to-one bit-flip errors and one-to-zero bit-flip errors.

The upper part in each of FIGS. 3 and 4 depicts a bit-flip count plane on which multiple bit-flip count dots corresponding to multiple readout results are scattered. The dots are scattered in accordance with the zero-to-one (horizontally) and one-to-zero (vertically) bit-flip counts in the respective readout results. The plane in FIGS. 3 and 4 can also be viewed as a two-dimensional vector space whose elements are defined by the bit-flip counts. Each of the readout results (and its respective bit-flip count dot) corresponds to one of the four impairment profiles PROF1 . . . PROF4 of Table 1 above. In the present example, the bit-flip counts were evaluated over data chunks that are a quarter of a data page in size. FIG. 3 relates to reading LSB data, whereas FIG. 4 relates to reading MSB data.

As seen in the upper parts of FIGS. 3 and 4, the dots corresponding to the different impairment profiles are grouped in essentially separated regions. This means that reading memory cells that have suffered from different types of impairments would typically result in different combinations of zero-to-one and one-to-zero bit-flip counts that are distinguishable from one another. As a result, by predefining disjoint clusters in the plane of the zero-to-one and one-to-zero bit-flip counts a mapping between the bit-flip counts and respective impairment profiles can be defined. Note that the clusters formed by reading LSB data are typically different from the clusters formed by reading MSB data.

The lower parts of FIGS. 3 and 4 depict four cluster centers denoted 80A . . . 80D and 84A . . . 84D for reading LSB and MSB data, respectively. The horizontal and vertical values of each cluster center are calculated by averaging (separately) the zero-to-one bit-flip counts and the one-to-zero bit-flip counts of the bit-flip count dots comprising the cluster. In some embodiments, the cluster centers are used as a compact representation of the mapping, wherein the bit-flip counts dot is classified, for example, by identifying the cluster center closest to that dot.

As described above, the disjoint clusters in the bit-flip count plane can be used as a mapping between bit-flip counts and respective impairment profiles, and thus can be used for classifying a group of memory cells to a respective impairment profile. Methods for determining the bit-flip counts and for adjusting readout parameters based on the impairment profile to which the memory cells are classified are described in detail below.

In the example described above separate mappings (e.g., clusters or cluster centers) are defined for reading LSB and MSB data in a two-dimensional plane. In other embodiments, the mapping is defined in a higher dimensional vector space, e.g., a four-dimensional vector space of the bit-flip counts resulting in reading both the LSB and MSB data.

Figure 5:
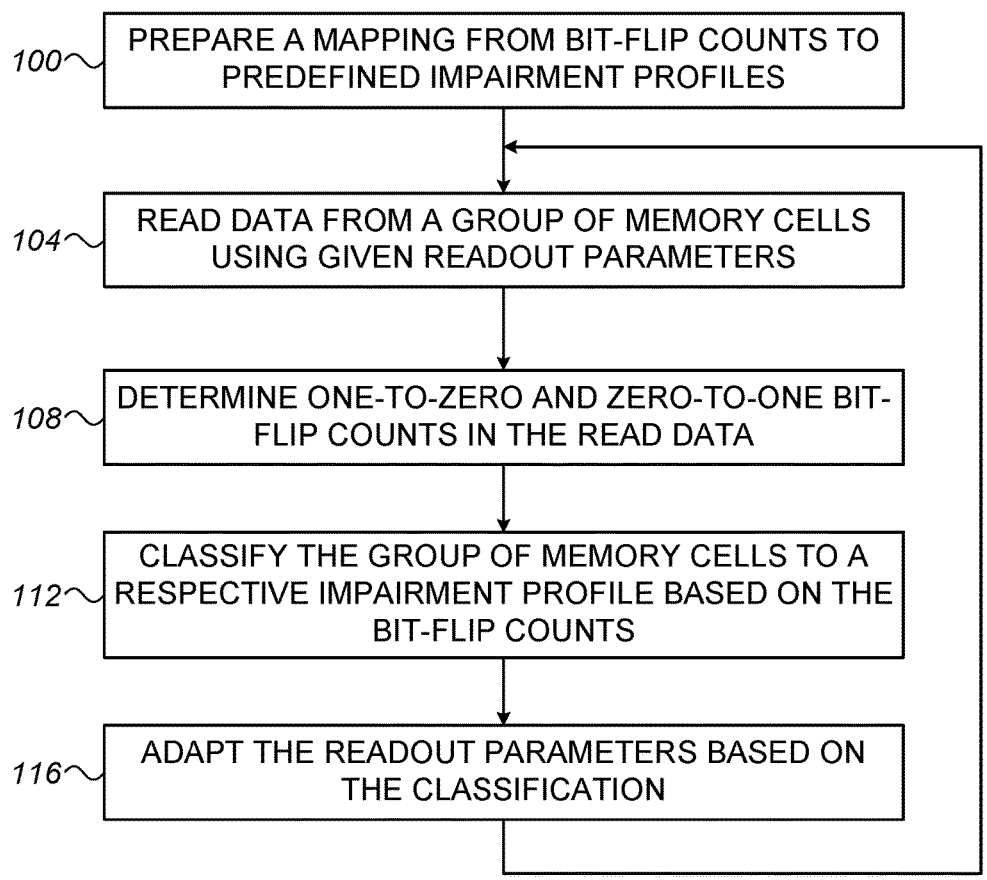
FIG. 5 is a flow chart that schematically illustrates a method for adjusting readout parameters based on classifying memory blocks to respective predefined impairment profiles, in accordance with an embodiment that is described herein.

Adjusting Readout Parameters Based on
Classifying Memory Cells to Impairment Profiles FIG. 5 is a flow chart that schematically illustrates a method for adjusting readout parameters based on classifying memory cells to respective predefined impairment profiles, in accordance with an embodiment that is described herein. In describing the method we assume a storage system such as system 20 of FIG. 1, in which the memory device stores 2 bits/cell.

In the present example, the memory controller classifies entire memory blocks to respective impairment profiles. In alternative embodiments, memory cells in suitable groups other than memory blocks can also be classified. In the method of FIG. 5 we assume that the memory controller reads full pages of LSB or MSB data in a read operation. In alternative embodiments, however, reading other suitable data units can also be used.

The method of FIG. 5 begins with memory controller preparing a mapping between bit-flip counts and respective predetermined impairment profiles, at a mapping preparation step 100. In the present example, the memory controller performs step 100 at the start of life of the memory device. Alternatively or additionally, the memory controller may perform step 100 during the lifetime of the device, e.g., after a long retention period.

In some embodiments, the mapping is determined offline, e.g., at production or at lab conditions, and at step 100 the memory controller receives the mapping, e.g., from host 52. Alternatively, the memory controller determines the mapping as will be described below. The memory controller stores the received or determined mapping for later use, e.g., locally in a volatile memory of the controller (not shown in FIG. 1), in non-volatile memory device 24, or both.

In some embodiments, to determine the mapping, the memory controller first stores known data in multiple memory blocks, and applies to selected groups of the memory blocks impairments of different types in accordance with the predefined impairment profiles.

After applying the impairments, the memory controller retrieves data pages stored in the selected memory blocks, using some default read thresholds, and evaluates for the resulting readouts respective zero-to-one and one-to-zero bit-flip counts by comparing the readout results with the known data. The default read thresholds may be set as optimal or close to optimal for the conditions present at start of life.

In some embodiments, the memory controller evaluates separate bit-flip counts for different bit significance data pages (LSB and MSB data pages for a 2 bit/cell memory device.) In the present example, the memory controller represents the mapping as cluster centers in a two-dimensional plane of the zero-to-one and one-to-zero error counts, wherein each cluster center corresponds to a respective impairment profile.

In some embodiments, instead of storing known data as described above, the memory controller stores in the memory blocks data that is encoded using a suitable Error Correcting Code (ECC), such as ECC 50 of FIG. 1. When reading the data back after applying the impairments, the memory controller decodes the ECC to derive decoded data, and specifies the error locations (if any), which the memory controller uses for counting separately the zero-to-one and one-to-zero bit-flip counts.

At a reading step 104, in an embodiment, the memory controller reads one or more LSB and/or MSB data pages of a memory block to be classified using the same read thresholds that were used for creating the mapping at step 100. Alternatively, the memory controller may use any other suitable read threshold setting, as will be described below. At a bit-flip counting step 108, the memory controller determines actual zero-to-one and one-to-zero bit-flip counts for the read pages. In some embodiments, the bit-flip counts used for defining the mapping at step 100 are normalized to some scale, such as counting the number of bit-flips per page or per memory block. In this case the memory controller accumulates or averages the bit-flip counts over the read data pages, to match the normalization scaling of the mapping.

At a classification step 112, the memory controller classifies the memory block to one of the predefined impairment profiles by mapping the actual set of zero-to-one and one-to-zero bit-flip counts evaluated at step 108 using the mapping of step 100. In this example, the memory controller finds the cluster center closest to the point represented by the actual set of zero-to-one and one-to-zero bit-flip counts. In other embodiments, the mapping is represented by disjoint clusters in the bit-counts plane (or vector space in general), and the memory controller maps the actual set of zero-to-one and one-to-zero bit-flip counts to the cluster in which the point represented by the actual set of zero-to-one and one-to-zero bit-flip counts falls.

At an adjustment step 116, the memory controller adjusts the read thresholds based on the impairment profile classified at step 112. In other embodiments, the memory controller adjusts other readout parameters such as reliability measures that are used for soft decoding of the ECC, as will be described below. Following step 116 the method loops back to step 104 to classify a subsequent memory block.

In some embodiments, the memory controller reads and decodes the data page using a soft decoding process: The memory controller reads a group of memory cells in which the page is stored one or more times, using one or more respective read thresholds, so as to produce readout results. The memory controller then uses the readout results to derive soft reliability measures for the readout values, and decodes the stored data based on the soft reliability measures. The soft reliability measures may comprise, for example, Log Likelihood Ratios (LLRs) for the possible bit values that may be stored in the memory cells.

In some embodiments, the memory controller derives the LLR values in respective soft zones (or simply zones for brevity) of the threshold voltage values. The soft zones may correspond to respective intervals between adjacent read thresholds. The memory controller typically assigns a respective predefined LLR value to the readout values that fall within each soft zone, wherein the predefined LLR values are typically predetermined offline assuming optimal (or other nominal) positioning of the read thresholds. When the memory cells suffer from one or more types of impairments, the soft zones used for evaluating the LLRs and the reliabilities assigned to readouts that fall in these soft zones may become suboptimal.

In some embodiments, at step 116, the memory controller uses the impairment profile to which the memory block was classified to adjust the soft reliability measures. For example, in one embodiment, the memory controller reconfigures the position and/or spacing of the soft zones, by modifying the respective read thresholds setting. For example, the memory controller can use a non-uniform zone spacing to compensate for non-optimal positioning of the read threshold. Alternatively or additionally, the memory controller can modify the LLR values assigned to the respective soft zones based on the classified impairment profile.

In some embodiments, the memory controller holds a predefined setting of the readout parameters (e.g., the read thresholds, soft zones and zone reliabilities) for each of the predefined impairment profiles. The memory controller uses these predefined settings for reading data pages of memory blocks upon classification, or for memory blocks whose classification is already known.

In some embodiments, after classifying a memory block to a respective impairment profile, the memory controller estimates the best setting of the readout parameters such as the read thresholds and soft zones, e.g., using a suitable acquisition process in which the memory controller seeks optimal readout parameters. The memory controller stores the estimated readout parameters in association with the respective impairment profile. The memory controller can then use the stored readout parameters in reading data from memory blocks classified to the same impairment profile.

In an embodiment, the memory controller marks the classification associated with already classified memory blocks, and uses the respective predefined or estimated settings of the readout parameters when reading data from these memory blocks.

In the example described above, a memory block is classified using the same read thresholds that were used for creating the mapping. In alternative embodiments, the memory controller holds separate mappings for different respective read threshold settings. In such embodiments the memory controller uses the mapping corresponding to the threshold setting being used. In an embodiment the controller holds a set of mappings corresponding to a set of predefined respective threshold settings. When reading using a threshold setting that does not belong to the predefined set the memory controller selects a mapping corresponding to a read threshold setting that is closest to the read threshold setting being used. In another embodiment, the controller interpolates the impairment profiles mapped from two (or more) read threshold settings neighboring to the read threshold setting being used.

The embodiments described above are given by way of example, and other suitable embodiments can also be used. For example, although the embodiments described above refer mainly to MLC devices that store 2 bits/cell, the disclosed techniques are similarly applicable to devices having other storage capacity, such as, for example, devices that store three or more bits/cell.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A storage apparatus, comprising:
   a plurality of memory cells; and
   storage circuitry, which is configured to:
   store a mapping that maps sets of multiple readout bit-flip counts to respective predefined impairment profiles, the impairment profiles specifying two or more severity levels of respective impairment types, the impairment types including read disturb, retention, and endurance, wherein each of the bit-flip counts comprises a one-to-zero error count or a zero-to-one error count;
   read data from a group of the memory cells using given readout parameters, and evaluate an actual set of bit-flip counts corresponding to the read data;
   classify the group of the memory cells to a respective impairment profile by mapping the actual set of the bit-flip counts using the mapping; and
   adapt the readout parameters based on the impairment profile to which the group of the memory cells was classified.

2. The storage apparatus according to claim 1, wherein the storage circuitry is configured to classify the group of the memory cells without directly measuring the severity levels.

3. The storage apparatus according to claim 1, wherein the storage circuitry is further configured to:
   store data in the group of the memory cells in data units of multiple respective bit-significance values;
   store a dedicated mapping for each respective bit-significance value;
   read from the group of the memory cells a data unit of a given bit-significance value; and
   classify the group of the memory cells using the dedicated mapping corresponding to the given bit-significance value.

4. The storage apparatus according to claim 1, wherein the storage circuitry is further configured to:
   read data that was encoded using an Error Correcting Code (ECC);
   evaluate the bit-flip counts by decoding the read data in accordance with the ECC, so as to derive decoded data and error locations; and
   compare the read data with the decoded data at the error locations.

5. The storage apparatus according to claim 1, wherein the readout parameters comprise one or more read thresholds, and wherein the storage circuitry is configured to adapt the readout parameters by modifying a position of at least one of the read thresholds.

6. The storage apparatus according to claim 1, wherein the readout parameters comprise multiple soft zones and respective zone-specific reliability measures for applying soft decoding to the read data, and wherein the storage circuitry is configured to adapt the readout parameters by modifying at least a soft zone spacing or a zone-specific reliability measure.

7. The storage apparatus according to claim 1, wherein the storage circuitry is configured to adapt the readout parameters based on corresponding readout parameters that were determined for another group of the memory cells classified to a same impairment profile.

8. The storage apparatus according to claim 1, wherein the storage circuitry is further configured to:
   store the mapping by defining for the impairment profiles respective disjoint clusters in a vector space of the readout bit-flip counts; and
   map the actual set of the bit-flip counts by finding a cluster to which a point in the vector space represented by the actual set of the bit-flip counts belongs.

9. The storage apparatus according to claim 1, wherein the storage circuitry is further configured to:
   store the mapping by storing for each impairment profile a cluster center in a vector space of the readout bit-flip counts; and map the actual set of the bit-flip counts by finding a cluster center closest to a point in the vector space represented by the actual set of the bit-flip-counts.

10. A method for data storage, comprising:
in a controller that stores data in a memory comprising multiple memory cells, storing a mapping that maps sets of multiple readout bit-flip counts to respective predefined impairment profiles, each impairment profile specifying two or more severity levels of respective impairment types, the impairment types including read disturb, retention, and endurance, wherein each of the bit-flip counts comprises a one-to-zero error count or a zero-to-one error count;
reading data from a group of the memory cells using given readout parameters, and evaluating an actual set of bit-flip counts corresponding to the read data;
classifying the group of the memory cells to a respective impairment profile by mapping the actual set of the bit-flip counts using the mapping; and
adapting the readout parameters based on the impairment profile to which the group of the memory cells was classified.

11. The method according to claim 10, wherein classifying the group of the memory cells comprises classifying the group of the memory cells without directly measuring the severity levels.

12. The method according to claim 10, further comprising storing data in the group of the memory cells in data units of multiple respective bit-significance values, wherein:
storing the mapping comprises storing a dedicated mapping for each respective bit-significance value;
reading the data comprises reading from the group of the memory cells a data unit of a given bit-significance value; and
classifying the group comprises classifying the group of the memory cells using the dedicated mapping corresponding to the given bit-significance value.

13. The method according to claim 10, wherein:
reading the data comprises reading data that was encoded using an Error Correcting Code (ECC); and
evaluating the bit-flip counts comprises decoding the read data in accordance with the ECC, so as to derive decoded data and error locations, and comparing the read data with the decoded data at the error locations.

14. The method according to claim 10, wherein the readout parameters comprise one or more read thresholds, and wherein adapting the readout parameters comprises modifying a position of at least one of the read thresholds.

15. The method according to claim 10, wherein the readout parameters comprise multiple soft zones and respective zone-specific reliability measures for applying soft decoding to the read data, and wherein adapting the readout parameters comprises modifying at least a soft zone spacing or a zone-specific reliability measure.

16. The method according to claim 10, wherein adapting the readout parameters comprises adapting the readout parameters based on corresponding readout parameters that were determined for another group of the memory cells classified to a same impairment profile.

17. The method according to claim 10, wherein:
storing the mapping comprises defining for the impairment profiles respective disjoint clusters in a vector space of the readout bit-flip counts; and
mapping the actual set of the bit-flip counts comprises finding a cluster to which a point in the vector space represented by the actual set of the bit-flip counts belongs.

18. The method according to claim 10, wherein:
storing the mapping comprises storing for each impairment profile a cluster center in a vector space of the readout bit-flip counts; and
mapping the actual set of the bit-flip counts comprises finding a cluster center closest to a point in the vector space represented by the actual set of the bit-flip-counts.

19. A controller, comprising:
an interface for communicating with a memory comprising multiple memory cells; and
storage circuitry, which is configured to:
store a mapping that maps sets of multiple readout bit-flip counts to respective predefined impairment profiles, each impairment profile specifying two or more severity levels of respective impairment types, the impairment types including read disturb, retention, and endurance, wherein each of the bit-flip counts comprises a one-to-zero error count or a zero-to-one error count;
read data from a group of the memory cells using given readout parameters, and evaluate an actual set of bit-flip counts corresponding to the read data;
classify the group of the memory cells to a respective impairment profile by mapping the actual set of the bit-flip counts using the mapping; and
adapt the readout parameters based on the impairment profile to which the group of the memory cells was classified.

20. The controller according to claim 19, wherein the storage circuitry is configured to classify the group of the memory cells without directly measuring the severity levels.

* * * * *